United States Patent [19]
Durose et al.
[11] 3,769,179
[45] Oct. 30, 1973

[54] COPPER PLATING PROCESS FOR PRINTED CIRCUITS

[75] Inventors: Arthur H. Durose, Richmond Heights; Thomas P. Malak, Garfield Heights, both of Ohio

[73] Assignee: Kewanee Oil Company, Bryn Mawr, Pa.

[22] Filed: Jan. 19, 1972

[21] Appl. No.: 219,116

Related U.S. Application Data

[63] Continuation-in-part of Ser. No. 30,977, April 22, 1970, abandoned, which is a continuation-in-part of Ser. No. 794,348, Jan. 27, 1969, abandoned.

[52] U.S. Cl. .......... 204/24, 204/52 R
[51] Int. Cl. .......... C23b 5/20, C23b 5/48
[58] Field of Search .......... 204/24, 52 R

[56] References Cited

UNITED STATES PATENTS

| | | | |
|---|---|---|---|
| 2,897,409 | 7/1959 | Gitto | 204/24 X |
| 2,424,887 | 7/1947 | Henricks | 204/52 R |
| 2,391,289 | 12/1945 | Beaver | 204/52 R |
| 2,602,774 | 7/1952 | Beaver | 204/52 R |
| 3,562,117 | 2/1971 | Vander Mey | 204/24 |
| 3,634,205 | 1/1972 | Melillo et al | 204/24 |

OTHER PUBLICATIONS

A. E. Linden, "Printed Circuits in Space Technology," pp. 109–111, (1962).
J. W. Dini, Plating, pp. 119–124, Feb. 1964.

*Primary Examiner*—G. L. Kaplan
*Attorney*—James A. Lucas

[57] ABSTRACT

A perforated printed circuit board is plated with a smooth and ductile deposit of copper from a high acid-low copper sulfate bath under conditions that give a copper deposit having a surface to hole thickness ratio of less than unity. Plating is carried out at a current density of between 15 and 60 asf using a bath maintained at a temperature of between 20° and 30°C., said bath containing 70–150 g/l of $CuSO_4 \cdot 5H_2O$ and 175–300 g/l of $H_2SO_4$ and preferably including 1 or more grain refining agents. The process is applicible to boards up to ⅛ inch thick and wherein the ratio of board thickness to hole diameter is between about 1/1 and 4/1.

7 Claims, No Drawings

COPPER PLATING PROCESS FOR PRINTED CIRCUITS

Related Applications

This application is a continuation-in-part of application Ser. No. 30,977, filed Apr. 22, 1970 which is a continuation-in-part of application Ser. No. 794,348, filed on Jan. 27, 1969 and both now abandoned.

BACKGROUND OF THE INVENTION

Large numbers of printed circuits are in use today in telecommunications, computers and other electronic applications. For reasons of compactness, systems employing printed circuits normally use printed circuit boards with circuits on both sides of one board or multi-layer boards having printed circuits at each interface between such multi-layer boards. Holes, or perforations, are drilled through the boards and the surface of these holes are made conductive to permit the circuit on one side of the board to be electrically connected to that on the other or to those on the internal layers in the case of multi-layer boards. The boards are generally made of paper-epoxy, paper-phenolic, or epoxy-glass cloth and in most cases are laminated with copper foil about 1.3 mils in thickness.

In the past, the connections between surfaces or layers on printed circuit boards were made by means of conductive rivets, eyelets or tubelets. However, it is now common practice to coat the non-conductive hole surface through which the various printed circuits are electrically connected with electroless copper and then to electroplate with copper. The electrodeposition of copper in such hole is effected to form a build-up of copper within the hole of approximately 1–2 mils in wall thickness. The copper electroplating process of the present invention deposits a copper electroplate that is no thicker and is preferably thinner on the outer surface of the printed circuit boards than it is on the inside surface of the holes in said printed circuit boards and avoids an excessive build-up of copper at the interface formed by the hole and the exterior surface of the printed circuit boards.

As can be seen from the foregoing, the copper plating bath, the process of deposition and the copper electroplate in order to be successfully utilized to form electrical connections through holes in printed circuit boards, must meet several requirements including the following:

1. The process must have good throwing power into small holes. These holes may be up to 380 mils long on multi-layer printed circuit boards and only 20 mils or less in diameter. This approaches the dimensions used in micro-throwing power measurements. Therefore, Haring Cell throwing power measurements may not predict the correct order among various solutions, nor will the Haring Cell necessarily give the correct hole throwing power ratios. Good throwing power into the holes of printed circuit boards is necessary to avoid wasteful deposition of copper on the faces of the boards which in turn would require more time and material in order to remove the unwanted copper in a later etching step. A longer etching time to remove such copper from the face of the printed circuit boards will frequently cause undercutting of the conductor lines on the faces of the boards. Also poor throwing power would have the tendency to close the openings of the small holes before enough copper has deposited on the walls of the holes.

2. The copper electroplate must be sufficiently ductile so as to withstand flexing of the printed circuit boards, mechanical shock and heat shock such as might be caused by soldering.

3. The deposit must be continuous and smooth.

Three types of copper electroplating solutions are used for plating onto the thin electroless copper deposit on the inside of the holes. These copper electroplating solutions are the sulfate, fluoborate and pyrophosphate type baths. In spite of its good throwing power, the cyanide copper plating solution is not used very often because it would attack the resists and laminating adhesives. In addition, there exist theoretical reasons to doubt that a cyanide solution would have significantly better throwing power into small holes than would the other solutions previously mentioned — sulfate, fluoborate and pyrophosphate.

Up to the present time, the pyrophosphate copper electroplate solution has usually been preferred. This is so primarily because of its better throwing power into holes when comparing prior art sulfate and fluoborate processes, (see J. Dini, Plating, Feb., 1964; B. Rothchild, Plating, April, 1966). The pyrophosphate copper electroplating solutions, however, do have disadvantages compared to the sulfate copper electroplate system. They are more expensive and more complicated to control and analyze. The pyrophosphate electrodeposits have a tendency to be brittle and have higher stress unless the ammonia content, $P_2O_7/Cu$ ratio, pH, temperature, and agitation ratios are controlled within specified limits. The pyrophosphate bath is highly susceptible to contamination by oil and adhesives and therefore, must be filtered frequently through activated carbon to remove the contaminants. For this reason, beneficial addition agents are difficult to maintain in balance. In addition, it should be pointed out that pyrophosphate type baths do not activate the surface of electroless copper as well as do acid copper electroplating solutions. Pyrophosphate electroplating baths also may have a lower limiting current density above which spongy deposits are formed which would be of no value in printed circuit manufacture.

The fluoborate copper plating bath exhibits the same susceptibility to contamination by organics as does the pyrophosphate bath. In addition, the fluoborate bath is very corrosive to tanks and other plating equipment and presents a health hazzard to personnel working with or in the vicinity of the bath. Another drawback is that the fluoborate bath is difficult to control during electroplating.

Copper sulfate electroplating baths which have heretofore been used for electroplating, electroforming or for plating on circuit boards have the composition ranges as follows:

| | |
|---|---|
| $CuSO_4 \cdot 5H_2O$ | 150–270 g/l |
| $H_2SO_4$ | 11–110 g/l |

These solutions, now referred to as high copper-low acid or HC–LA baths, exhibit relatively poor throwing power resulting in an S/H ratio (the ratio of the copper thickness on the surface of the board to the thickness in the hole) considerably greater than unity. Furthermore, the resultant deposit is much coarser than is generally regarded as acceptable by circuit board users.

A detailed analysis dealing with various parameters that affect the throwing power of electrolplating baths including HC–LA copper plating baths is reported in Haring and Blum in Transactions of the American Electrochemical Society, 44, 313 et seq (1923). The authors point out that the throwing power of an acid copper bath is generally improved by increasing the acid content of the bath, reducing the copper content and keeping the temperature, agitation and current density at a minimum during electroplating. In the article, they show the derivation of a formula for determining the relative current distribution on two cathodes spaced at unequal distances from an anode. From this formula they are able to calculate the throwing power of an electroplating bath. It can be seen from their formula that the best possible ratio of thickness of copper on the surface on a printed board compared to that deposited in a hole extending through the printed board would approach unity.

BRIEF DESCRIPTION OF THE INVENTION

It is an object of the present invention to provide a copper electroplate for a printed circuit board which has an S/H ratio less than that which has heretofore been thought to be possible.

Another object of this invention is the production of a printed circuit board using a copper electrodeposition process which fully meets the requirements for electroplating electrical connections in holes in printed circuit boards.

These objects are achieved according to the present invention which involves an acid copper sulfate solution which has better through hole throwing power than any previously used acid copper sulfate solution and which has better through hole throwing power than a pyrophosphate electroplating solution. The resulting copper electroplate displays exceptional ductility and smoothness.

In more detail, the instant invention involves the use of a novel acid copper sulfate electroplating solution which has the ability to deposit copper with improved throwing power into small holes in the article being electroplated. Specifically, the instant invention involves the use of an electroplating solution for electroplating copper deposits on printed circuit boards containing one or more drilled holes such that the ratio of thickness of copper deposited on the face of the board to that on the inside surface of the drilled holes is less than unity. These desirable results can be achieved on printed circuit boards as thick as ⅛ inch and wherein the diameter of the drilled hole is as small as 25 percent of the board thickness. In light of the parameters and limitations taught by Haring et al. supra, these results are surprising and quite unexpected. Although the present invention is described in terms of its use in the manufacture of printed circuit boards, it should be understood that it can be utilized in any copper plating application which requires exceptional ductility and smoothness from a process having extremely good throwing power.

DETAILED DESCRIPTION OF THE INVENTION

It has now been found that by substantially decreasing the copper content in the sulfate electroplating solutions of the prior art and substantially increasing the acid or sulfate content, much better "thru-hole" deposit distribution is obtained. The electroplating baths of the instant invention should contain between 70 – 150 grams per liter of $CuSO_4 \cdot 5H_2O$ and between about 175 – 300 grams per liter of $H_2SO_4$. This bath composition may be modified by replacing up to about 25 percent of the sulfuric acid with an equivalent amount of fluoborate or an alkali metal sulfate, if desired. The copper electroplating bath used in the teachings of the instant invention may therefore be described as a high acid-low copper (HA-LC) electroplating bath. This HA-LC electroplating bath is operated at temperatures of about 20°–30°C, preferably about 22°–27°C, and a cathode current density in the range of approximately 15–60, and preferably 20–35, amps per square foot.

This electroplating solution gives "thru-hole" throwing power values which are better than the more complicated pyprophosphate solutions. However, we are dealing in an area where the dimensions approach those used in micro-throwing power measurements and the Haring Cell may not give the correct hole throwing power ratios, except for larger holes.

In order to accomplish the objectives of the present invention, it is necessary to incorporate a grain refining agent into the bath. This agent serves to prevent the copper from depositing on the panel in a coarse, nodular or columnar structure.

Surprisingly, however, some of the common addition agents for grain refinement in acid copper electroplating solutions do not give grain refining in the HA–LC electroplating solutions of the instant invention or in some cases where grain refining is obtained, brittleness is encountered in the HA–LC solution of the instant invention. Such is the case for common addition agents such as phenolsulfonic acid, ethylenediamine, triethanolamine, cystein, peptone, glucose and benzothiazole. Other addition agents such as benzoquinone produce fine grained ductile deposits but are harmful for "thru-hole" throwing power. Suitable grain refining addition agents useful in the practice of the instant invention are shown in the following table:

| Agent | Concentration Range |
|---|---|
| Molasses | 0.5–5 cc/l |
| Instant Coffee | 0.1–1.0 g/l |
| Caffeine (1,3,7-trimethyl xanthine) | 0.1–1.0 g/l |
| Gum Arabic | 0.1–1.0 g/l |
| Polyethyleneglycol | 0.01–1.0 g/l |

Instant coffee includes ground roasted and freeze dried coffee as well as the de-caffinated instant coffees. They polyethylene-glycol above mentioned may have a molecular weight from 200–6000 or more.

Another suitable grain refiner useful with the HA–LC electroplating solution of the instant invention is the colored impurity found in sodium metanilate. Contrary to what has been generally assumed, it has been found that pure sodium metanilate has no effect in such copper electroplating solutions. Commercial sodium metanilate, however, may be used beneficially in the HA–LC solution of the present invention for the purpose of grain refinement since it does contain an active impurity. A concentration of the commercial sodium metanilate in a range of 0.05 to 8.0 g/l has been found to be satisfactory.

Two other materials have small but definite beneficial effects when added to the HA–LC electroplating solutions of the instant invention. These are phosphoric acid and chloride ion. Phosphoric acid (85 percent by volume) when used in an amount of from about 1 to 10 cc/l. reduces burning of the deposit at high current densities and promotes uniform anode corrosion which contributes to the formation of a smooth electrodeposit. Chloride ions, when present in an amount of between 10 and 250 ppm serve to prevent step plating, skip plating or tailing, thus promoting a deposit that is free of defects.

It is common practice to evaluate the "thru-hole" throwing power of solutions by plating one or two mils of metal onto a circuit board which has holes of various sizes drilled through it. The electrodeposit thickness on the outside flat surface (S) of the circuit board and that at the center surface of the hole (H) midway between the two flat surfaces of the circuit board are then measured. The hole throwing power is then expressed as the ratio S/H, a low ratio obviously being desirable. The S/H ratio will vary depending on the electroplating solution used, the thickness of the board, the diameter of the hole and the rate of agitation of the electroplating solution. If a large hole e.g. 125 mil in diameter on a thin circuit board e.g. 62 mils thick is used, there is no great advantage in choosing one copper electroplate deposition process over another. In other words, the normal sulfate, fluoborate, pyrophosphate or the instant HA–LC electroplating bath would have no advantage over one another. However, as the hole diameter decreases and the circuit board thickness increases, then definite advantages exist in favor of the pyrophosphate and HA–LC electroplate baths with the HA–LC electroplating baths being preferable due to their easy control and better throwing power in the extreme situations. The thickness of a single circuit board is typically about 62 mils and will not normally exceed about 125 mils while the holes may be as small as 15 or 20 mils in diameter. The present invention is applicable to boards in which the ratio of the board thickness (T) to the hole diameter (D) is between about 1 and 4. In these ranges, S/H ratios below 0.6 have been obtained by use of the low copper-high acid plating baths of the present invention.

Specific examples used to illustrate and define the parameters of the present invention are as follows:

EXAMPLE I

The following solutions were prepared.

| | A | B | C | D |
|---|---|---|---|---|
| $CuSO_4 \cdot 5H_2O$ | 210 g/l | 248g/l | 122g/l | 120g/l |
| $H_2SO_4$ | 53 | 75 | 194 | 220 |
| Instant Coffee | — | — | — | 0.5 g/l |
| Commercial Sodium Metanilate | — | 8 | 8 | — |
| $H_3PO_4$ | — | 8 | 8 | 8 |
| $Cl^-$ | 0.015 | 0.015 | 0.015 | 0.015 |

| | E |
|---|---|
| $CuP_2O_7 \cdot 3H_2O$ | 63 g/l |
| $K_4P_2O_7$ | 262 g/l |
| pH (with $NH_4OH$) | 8.0 |
| Temperature | 50°C |

A 2 × 2 × 6 inches Haring Cell was used for measuring throwing power. The near and far cathodes were 1 and 5 inches from the gauze anode. The acid sulfate solutions were operated at room temperature and at a current density of 40 asf. The B.S.I. throwing power formula was used with the following results with a higher number representing better throwing power.

| Solution | Throwing Power |
|---|---|
| A | 6.9 |
| B | 10.6 |
| C | 34.6 |
| D | 45 |
| E | 32 |

It is noted that the throwing power of the high acid-low copper sulfate baths (C and D) exceeds that of the pyrophosphate bath.

EXAMPLE 2

The same solutions as those in Example 1 were used for plating on 1/16 inch thick laminated circuit boards. Holes, 26 mils in diameter, were drilled in these boards and the boards were cleaned and coated with electroless copper. The ratio of board thickness to hole diameter was about 2.4. About 2 mils of copper was electroplated on the face of the boards using air agitation, and thicknesses were determined microscopically. The S/H values were:

| Solution | S/H at 40 asf | S/H at 20 asf |
|---|---|---|
| A | 3.0 | 2.5 |
| B | 2.35 | 1.97 |
| C | 1.3 | 1.2 |
| D | 0.85 | 0.80 |
| E | 1.5 | 1.39 |

As the acid content of the copper sulfate bath was increased from 53 g/l to 220 g/l the S/H ratio diminished until it was less than unity. The results were better at 20 asf than at 40 asf for solutions A through D.

EXAMPLE 3

An electroplating bath was prepared and used at room temperature for plating 1/16 inch thick boards containing 27 mil diameter holes at 40 asf for a period of 35 minutes. The thickness to diameter ratio was 2.3/1. Agitation was provided in the bath by reciprocating the cathode parallel to the anodes. The plating bath was made up as follows: $CuSO_4 \cdot 5H_2O$ — 120 gms/liter; $H_2SO_4$ — 210 gms/liter) $H_3PO_4$ — 8 gms/liter and ground roasted instant coffee 0.5 gms/liter. The S/H ratio was 0.83 with the thickness of the copper plate on the surface being 1 mil.

EXAMPLES 4 – 11

These examples further demonstrate the use of the invention to produce copper electrodeposits that are thicker in the holes than on the surface.

Brass panels 2 × 2 inches × 62 mils were drilled with holes of 16, 21, 36, 52 and 62 mils diameter and were then plated at a temperature of about 28°C from a high acid-low copper bath as shown in Table I. Ground roasted instant coffee was added to the bath in an amount of 0.5 g/l as a grain refining agent and 8 g/l of $H_3PO_4$ was also added. The bath was agitated, mechanically alone or with air during plating.

TABLE I

| Example | $CuSO_4$ (g/l) | $H_2SO_4$ (g/l) | Hole diameter (mils) | Plating time (minutes) | Current density | Panel thickness (T)/ hole diameter (D) | S/H |
|---|---|---|---|---|---|---|---|
| 4 | 120 | 179 | 62 | 45 | 40 | 1.0 | .87 |
| 5 | 126 | 209 | 52 | 45 | 40 | 1.2 | .91 |
| 6 | 126 | 209 | 62 | 45 | 40 | 1.0 | .91 |
| 7 | 126 | 209 | 52 | 45 | 50 | 1.2 | .88 |
| 8 | 126 | 209 | 62 | 45 | 50 | 1.0 | .88 |
| 9 | 122 | 261 | 35 | 45 | 40 | 1.77 | .83 |
| 10 | 122 | 261 | 52 | 45 | 40 | 1.2 | .75 |
| 11 | 122 | 261 | 62 | 45 | 40 | 1.0 | .71 |

The table shows the test results wherein the S/H is less than 1.0. All of the remaining copper deposit thickness ratios were unity or above and are not reported on the table.

EXAMPLES 12 – 16

Additional brass panels, drilled in accordance with the procedure described in Examples 4–11 were plated in a bath having the following composition:

| | |
|---|---|
| $CuSo_4 \cdot 5H_2O$ | 120 g/l |
| $H_2SO_4$ | 210 g/l |
| $H_3PO_4$ (22% by vol.) | 20 ml. |
| Coffee (2.5% aq. sol.) | 20 ml. |

One panel was plated at a temperature of 22°C, another at 28°C, and a third at 33°C, at a current density of 40 asf, with forced flow agitation. The thickness of the copper deposit on the surface and in the hole was measured by cross-sectioning. The results, as shown in Table II below, reveal that the throwing power of the bath decreases as the temperature increased from 22°C to 33°C and that the criticality of the bath temperature is greater at smaller hole diameters.

TABLE II

| Example | Hole Diameter (mils) | T/D | S/H: 22°C | 28°C | 33°C |
|---|---|---|---|---|---|
| 12 | 16 | 3.9 | 0.91 | 1.4 | 2.04 |
| 13 | 21 | 2.95 | 0.72 | 1.27 | 1.5 |
| 14 | 35 | 1.77 | 0.67 | 1.03 | 1.1 |
| 15 | 52 | 1.2 | 0.63 | 1.02 | 1.0 |
| 16 | 62 | 1.0 | 0.59 | 0.88 | 0.88 |

EXAMPLE 17

A commercial electroplating bath of the present invention was used at 23°C to plate 1/16 inch thick electroless copper coated printed circuit boards containing 27 mil diameter holes at a current density of 35 asf for a period of 40 minutes. Agitation was provided by moving the cathode parallel to the anodes and by filtration of the solution through carbon. The plating bath had the composition:

| | |
|---|---|
| $CuSO_4 \cdot 5H_2O$ | 120 g/l |
| $H_2SO_4$ | 210 g/l |
| $H_3PO_4$ (85%) | 8 g/l |
| Instant Coffee | 0.5 g/l |
| $Cl^-$ | 0.015 g/l |

After plating, the board was cross-sectioned and the thickness of copper on the surface and at the center of the hole was measured and found to be

| | |
|---|---|
| Surface | 0.96 mils |
| Hole | 1.16 mils |
| S/H | 0.83 |

A section of the plated board was conditioned at 121°C for 1 hour and then thermal tested by floating on a 288°C solder bath (Sn=63 percent) for 10 seconds. The board was then cross-sectioned and no cracking of the copper deposit at the surface-hole corner was observed. Another board plated in a HA–LC bath without a grain refiner showed a similar S/H ratio of less than 1/1 but exhibited severe cracking on the corners when subjected to thermal testing.

EXAMPLE 18

The bath of Example 17 was used to prepare 4 + 4 inches + 3 mil copper foils. These were then cut to test specimen size and percentage elongation determined according to ASTM method E 345–69. A value range of 11–14 percent was obtained. A foil plated from a HA–LC bath containing no grain refiner gave a value of 2–4 percent elongation. In all of the foregoing examples, the copper thickness in the holes was determined midway between the two planar surfaces of the panel or plate, rather than at the edges of the holes, where the panel or plate, rater than at the edges of the holes, where there is a tendency for the deposit to build up. Although prior efforts have resulted in S/H ratios of less than 1.0, these were based upon panels where (a) the diameter of the hole was large, i.e. equal to or greater than the thickness of the panel or (b) the thickness of the copper electrodeposit was an average thickness or was measured at the edges of the hole rather than the middle where the minimum thickness generally occurs. The results of the present invention are substantially better than these prior efforts.

Two or more grain refining agents can be added concurrently or successively to the plating bath without departing from the scope of the present invention. These agents are generally additive in effect and the proper amounts of each can be readily determined by trial and error.

Although the foregoing discussion and examples have been used to illustrate the present invention and the practice thereof, they should not be construed as a limitation thereof.

Instead, the invention is limited only by the claims wherein we claim:

1. The process of depositing an electrolytic layer of copper on a printed circuit board having a thickness of 125 mils or less and having at least one hole extending therethrough, wherein the thickness of the board is between about 1 and about 4 times the diameter of the hole, said process comprising:

a. electrolyzing an aqueous acid copper electroplating solution consisting essentially of between about 70 and about 150 g/l of $CuSo_4 \cdot 5H_2O$, between about 175 and about 300 g/l of free $H_2SO_4$ and at least one of the following grain refining agents used within the range indicated:

| | |
|---|---|
| Molasses | 0.1 to 1.0 g/l |
| Instant Coffee | 0.1 to 1.0 g/l |
| Caffeine | 0.1 to 1.0 g/l |
| Gum Arabic | 0.1 to 1.0 g/l |

and

| | |
|---|---|
| Polyethyleneglycol | 0.01 to 1.0 g/l; |

and b. electrodepositing a layer of copper on said printed circuit board from said bath at a current density of between about 15 and about 60 asf and at a bath temperature of between about 20° and about 30°C, whereby the ratio of the thickness of the copper layer deposited in said at least one hole to the thickness of the copper layer deposited on the surface of the board is greater than 1 to 1.

2. The method of claim 1 further including the addition of $H_3PO_4$ in an amount equivalent to 1–10 cc/liter.

3. The method of claim 2 further including the addition of between about 10 and 250 ppm of $Cl^-$ ions.

4. The process of producing a smooth, ductile defect-free layer of copper on a printed circuit board having a plurality of holes extending therethrough, said board having a thickness no greater than about 125 mils and the holes having a diameter of between about 25 percent and about 100 percent of said thickness, wherein the thickness of the copper layer in the holes exceeds that on the surface of the boards comprising electrodepositing the copper from an aqueous acid copper bath having the following composition:

| | |
|---|---|
| $CuSO_4 \cdot 5H_2O$ | 75–150 g/l |
| $H_2SO_4$ (free) | 175–300 g/l |
| Instant Coffee | 0.1–1.0 g/l |
| $H_3PO_4$ | 1–10 cc/liter |
| $Cl^-$ | 10–250 ppm |

at a current density of between about 15 and about 60 amps per square foot and at a bath temperature of between about 20° and 30°C.

5. The process of claim 4 wherein the bath is agitated during electrodeposition.

6. The process of claim 5 wherein agitation of the bath includes filtration of the bath through carbon.

7. The process of claim 4 wherein the current density is maintained in a range of between about 20 and 35 amps per square foot and a temperature of 22°–27°C.

* * * * *